US012601052B2

(12) United States Patent
Sakai et al.

(10) Patent No.: US 12,601,052 B2
(45) Date of Patent: Apr. 14, 2026

(54) SUBSTRATE PROCESSING APPARATUS, SUBSTRATE PROCESSING METHOD, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Masanori Sakai, Toyama (JP); Tsutomu Kato, Toyama (JP); Atsuhiko Ashitani, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 824 days.

(21) Appl. No.: 17/696,615

(22) Filed: Mar. 16, 2022

(65) Prior Publication Data

US 2022/0205089 A1 Jun. 30, 2022

Related U.S. Application Data

(63) Continuation of application No. PCT/JP2020/028905, filed on Jul. 28, 2020.

(30) Foreign Application Priority Data

Sep. 19, 2019 (JP) ................................. 2019-170304

(51) Int. Cl.
*C23C 16/44* (2006.01)
*C23C 16/455* (2006.01)
*H01L 21/677* (2006.01)

(52) U.S. Cl.
CPC ...... *C23C 16/4408* (2013.01); *C23C 16/4412* (2013.01); *C23C 16/45578* (2013.01); *H01L 21/67757* (2013.01)

(58) Field of Classification Search
CPC ......... H01L 21/67757; H01L 21/28556; C23C 16/4408; C23C 16/4412; C23C 16/45544;
(Continued)

(56) References Cited

U.S. PATENT DOCUMENTS 5,415,585 A * 5/1995 Miyagi ............... C23C 16/4412
422/2
6,074,486 A * 6/2000 Yang ...................... H10D 1/712
118/730
(Continued)

FOREIGN PATENT DOCUMENTS

JP 05-070954 A 3/1993
JP 2005-223144 A 8/2005
(Continued)

OTHER PUBLICATIONS

Notice of Reasons for Refusal with English translation in Japanese Application No. 2021-546535, issued Sep. 8, 2022, 10 pages.
(Continued)

*Primary Examiner* — Kurt Sweely
(74) *Attorney, Agent, or Firm* — Edell, Shapiro & Finnan, LLC

(57) ABSTRACT

There is provided a technique capable of detoxifying a process gas even when the detoxification apparatus is stopped. According to one aspect thereof, there is provided a substrate processing apparatus including: a reaction tube; a process gas supplier; an exhauster; an exhaust gas process chamber in which the exhausted process gas is subject to a process; a first inert gas supplier; a second inert gas supplier; an exhaust pipe; and a controller controlling the first and the second inert gas supplier such that the first inert gas is supplied to the exhaust gas process chamber through the first inert gas supplier while the process gas is subject to the process in the exhaust gas process chamber and the second inert gas is supplied to the exhaust gas process chamber (Continued)

through the second inert gas supplier when the process in the exhaust gas process chamber is stopped.

19 Claims, 8 Drawing Sheets

(58) Field of Classification Search
CPC .......... C23C 16/45578; H01J 37/32834; H01J 37/32844
See application file for complete search history.

(56) References Cited

U.S. PATENT DOCUMENTS

| | | | | |
|---|---|---|---|---|
| 6,527,884 | B1 | 3/2003 | Takakuwa et al. | |
| 6,716,477 | B1 * | 4/2004 | Komiyama | C23C 16/52 |
| | | | | 427/8 |
| 2005/0115674 | A1 * | 6/2005 | Taguchi | F23G 7/065 |
| | | | | 438/689 |
| 2005/0161158 | A1 * | 7/2005 | Schumacher | C23C 16/4412 |
| | | | | 156/345.29 |
| 2006/0121211 | A1 * | 6/2006 | Choi | C23C 16/455 |
| | | | | 427/248.1 |
| 2006/0162742 | A1 * | 7/2006 | Moriya | H01J 37/32862 |
| | | | | 134/1.1 |
| 2010/0071548 | A1 * | 3/2010 | Smith | C23C 16/4412 |
| | | | | 95/3 |
| 2012/0031266 | A1 * | 2/2012 | Amikura | B01D 53/30 |
| | | | | 96/421 |
| 2012/0304930 | A1 * | 12/2012 | Verdict | C23C 16/4412 |
| | | | | 55/344 |
| 2013/0164943 | A1 * | 6/2013 | Koshi | C23C 16/24 |
| | | | | 118/712 |
| 2014/0213069 | A1 | 7/2014 | Takebayashi et al. | |
| 2015/0330631 | A1 | 11/2015 | Amikura et al. | |
| 2018/0080122 | A1 * | 3/2018 | Ogawa | C23C 16/45531 |

FOREIGN PATENT DOCUMENTS

| | | | |
|---|---|---|---|
| JP | 2006-303414 | A | 11/2006 |
| JP | 3145006 | U | 9/2008 |
| JP | 2009-088308 | A | 4/2009 |
| JP | 2010-073772 | A | 4/2010 |
| JP | 2010-207771 | A | 9/2010 |
| JP | 2012-038962 | A | 2/2012 |
| JP | 2013-153159 | A | 8/2013 |
| JP | 2014-168046 | A | 9/2014 |
| JP | 2015-052420 | A | 3/2015 |
| JP | 2015-220263 | A | 12/2015 |
| JP | 2016-176095 | A | 10/2016 |
| KR | 10-2007-0036249 | A | 4/2007 |

OTHER PUBLICATIONS

Office Action in Singapore Application No. 112022026375, dated Jun. 7, 2024, 7 pages.
Request for the Submission of an Opinion with English translation in Korean Application No. 10-2022-7008610, dated May 8, 2024, 10 pages.
Second Office Action with English translation in Chinese Application No. 202080060372.7, dated May 15, 2024, 7 pages.
Official Action in Singapore Application No. 11202202637S, dated Aug. 28, 2023, 8 pages.
Notice of First Examination Opinion with English translation in Chinese Application No. 202080060372.7, dated Aug. 31, 2023, 16 pages.

* cited by examiner

SUBSTRATE PROCESSING APPARATUS, SUBSTRATE PROCESSING METHOD, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application is a continuation of International Application No. PCT/JP2020/028905, filed on Jul. 28, 2020, which claims priority under 35 U.S.C. § 119 to Application No. JP 2019-170304 filed on Sep. 19, 2019, the entire contents of which are hereby incorporated by reference.

TECHNICAL FIELD

The present disclosure relates to a substrate processing apparatus, a substrate processing method, a method of manufacturing a semiconductor device and a non-transitory computer-readable recording medium.

BACKGROUND

In a substrate processing apparatus used in a manufacturing process of a semiconductor device, a detoxification process is performed by using a detoxification apparatus with respect to a process gas used in the substrate processing apparatus.

When the detoxification apparatus described above is stopped for some reason, the process gas should be detoxified by other method.

SUMMARY

According to the present disclosure, there is provided a technique capable of detoxifying a process gas even when a detoxification apparatus is stopped.

According to one or more embodiments of the present disclosure, there is provided a technique related to a substrate processing apparatus including: a reaction tube in which a substrate is accommodated; a process gas supplier through which a process gas is supplied into the reaction tube; an exhauster through which the process gas is exhausted from the reaction tube; an exhaust gas process chamber connected to the exhauster and in which the exhausted process gas is subject to a process; a first inert gas supplier connected to an inert gas supply source supplying a first inert gas into the reaction tube and through which the first inert gas is supplied to the exhaust gas process chamber; a second inert gas supplier through which a second inert gas is supplied to the exhaust gas process chamber; an exhaust pipe through which a gas in the exhaust gas process chamber is exhausted; and a controller configured to be capable of controlling the first inert gas supplier and the second inert gas supplier such that the first inert gas is supplied to the exhaust gas process chamber through the first inert gas supplier while the process gas is subject to the process in the exhaust gas process chamber and the second inert gas is supplied to the exhaust gas process chamber through the second inert gas supplier when the process in the exhaust gas process chamber is stopped.

BRIEF DESCRIPTION OF THE DRAWINGS

FIG. 2 is a diagram schematically illustrating a horizontal cross-section, taken along the line A-A shown in FIG. 1, of the vertical type process furnace of the substrate processing apparatus according to the embodiments of the present disclosure.

FIG. 4 is a block diagram schematically illustrating a configuration of a controller and related components of the substrate processing apparatus according to the embodiments of the present disclosure.

DETAILED DESCRIPTION

Embodiments

Figure 1:
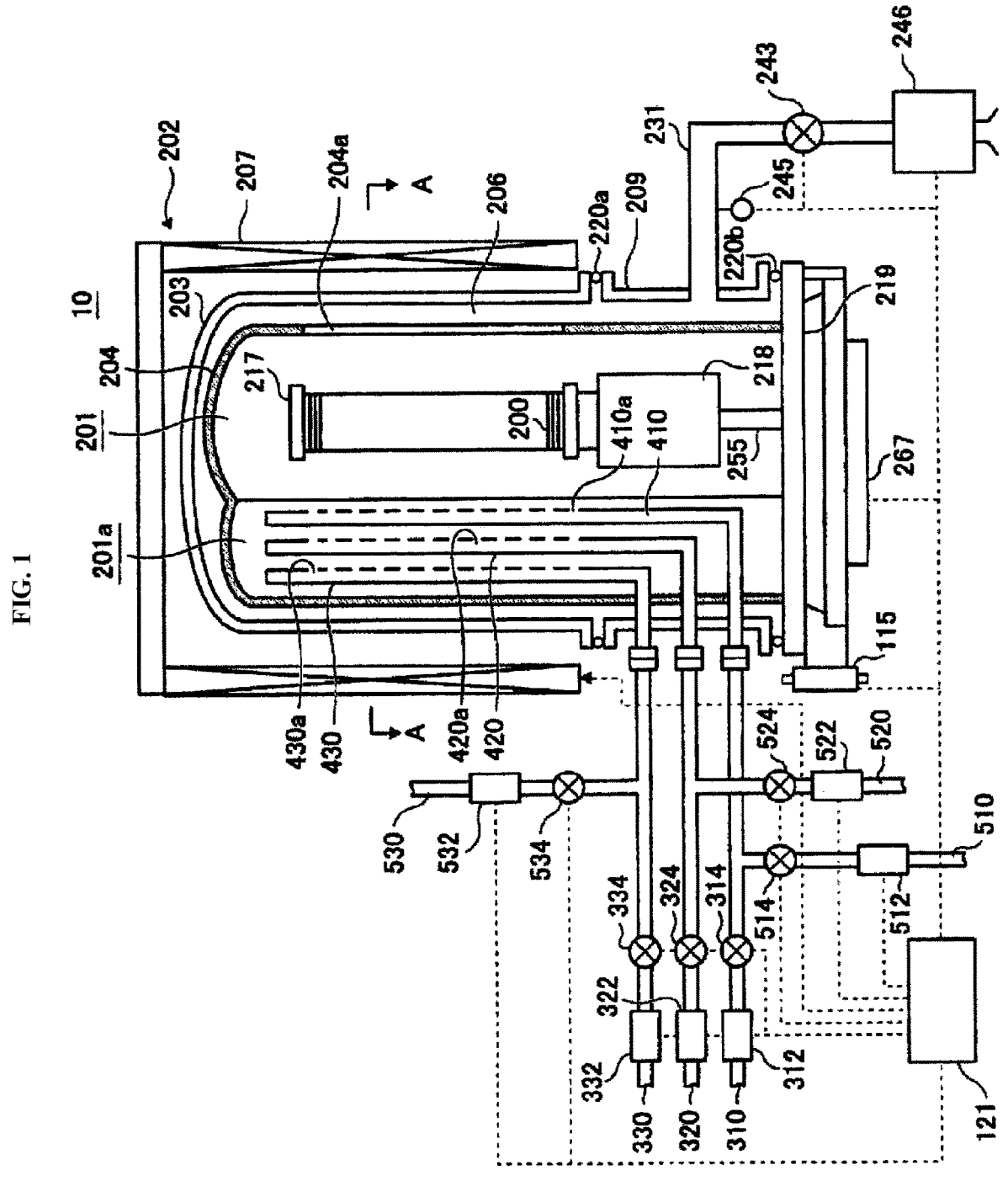
FIG. 1 is a diagram schematically illustrating a vertical cross-section of a vertical type process furnace of a substrate processing apparatus according to one or more embodiments of the present disclosure.

Hereinafter, one or more embodiments (also simply referred to as "embodiments") according to the technique of the present disclosure will be described.

(1) Configuration of Substrate Processing Apparatus

A substrate processing apparatus 10 includes a process furnace 202. The process furnace 202 is provided with a heater 207 serving as a heating apparatus (which is a heating structure or a heating system). The heater 207 is of a cylindrical shape, and is vertically installed while being supported by a heater base (not shown) serving as a support plate.

An outer tube 203 constituting a reaction vessel (which is a process vessel) serving as a reaction tube is provided in an inner side of the heater 207 to be aligned in a manner concentric with the heater 207. For example, the outer tube 203 is made of a heat resistant material such as quartz ($SiO2$) and silicon carbide (SiC). For example, the outer tube 203 is of a cylindrical shape with a closed upper end and an open lower end. A manifold (which is an inlet flange) 209 is provided under the outer tube 203 to be aligned in a manner concentric with the outer tube 203. For example, the manifold 209 is made of a metal such as stainless steel (SUS). The manifold 209 is of a cylindrical shape with open upper and lower ends. An O-ring 220a serving as a seal is provided between the upper end of the manifold 209 and the outer tube 203. As the manifold 209 is supported by the heater base (not shown), the outer tube 203 is installed vertically.

An inner tube 204 constituting the reaction vessel serving as the reaction tube is provided in an inner side of the outer tube 203. For example, the inner tube 204 is made of a heat resistant material such as quartz ($SiO_2$) and silicon carbide (SiC). For example, the inner tube 204 is of a cylindrical shape with a closed upper end and an open lower end. The process vessel (reaction vessel) serving as the reaction tube is constituted mainly by the outer tube 203, the inner tube 204 and the manifold 209. A process chamber 201 is provided in (or defined by) a hollow cylindrical portion of the process vessel (that is, an inner side of the inner tube 204).

The process chamber 201 is configured to stack and accommodate a plurality of wafers including a wafer 200 serving as a substrate in a horizontal orientation in a multistage manner along a vertical direction by a boat 217 described later. Hereinafter, the plurality of wafers including the wafer 200 may also be simply referred to as wafers 200.

Nozzles 410, 420 and 430 are installed in the process chamber 201 so as to penetrate a side wall of the manifold 209 and the inner tube 204. Gas supply pipes 310, 320 and 330 are connected to the nozzles 410, 420 and 430, respectively. However, the process furnace 202 according to the present embodiments is not limited thereto.

Mass flow controllers (MFCs) 312, 322 and 332 serving as flow rate controllers (flow rate control structures) and valves 314, 324 and 334 serving as opening/closing valves are sequentially installed at the gas supply pipes 310, 320 and 330 in this order from upstream sides to downstream sides of the gas supply pipes 310, 320 and 330, respectively, in a gas flow direction. Gas supply pipes 510, 520 and 530 through which an inert gas is supplied are connected to the gas supply pipes 310, 320 and 330 at downstream sides of the valves 314, 324 and 334, respectively. Mass flow controllers (MFCs) 512, 522 and 532 serving as flow rate controllers (flow rate control structures) and valves 514, 524 and 534 serving as opening/closing valves are sequentially installed at the gas supply pipes 510, 520 and 530 in this order from upstream sides to downstream sides of the gas supply pipes 510, 520 and 530 respectively, in the gas flow direction.

The nozzles 410, 420 and 430 are connected to front ends (tips) of the gas supply pipes 310, 320 and 330, respectively. Each of the nozzles 410, 420 and 430 may be implemented as an L-shaped nozzle, and a horizontal portion of each of the nozzles 410, 420 and 430 is installed so as to penetrate the side wall of the manifold 209 and the inner tube 204. A vertical portion of each of the nozzles 410, 420 and 430 is installed in a spare chamber 201a of a channel shape (a groove shape) protruding outward in a radial direction of the inner tube 204 and extending in the vertical direction. That is, the vertical portion of each of the nozzles 410, 420 and 430 is installed in the spare chamber 201a toward an upper portion of the inner tube 204 (in an upward direction in which the wafers 200 are arranged) and along an inner wall of the inner tube 204.

The nozzles 410, 420 and 430 are provided so as to extend from a lower region of the process chamber 201 to an upper region of the process chamber 201, and are provided with a plurality of gas supply holes 410a, a plurality of gas supply holes 420a and a plurality of gas supply holes 430a, respectively, at positions facing the wafers 200. Thereby, a gas such as a process gas is supplied to the wafers 200 through the gas supply holes 410a of the nozzle 410, the gas supply holes 420a of the nozzle 420 and the gas supply holes 430a of the nozzle 430. The gas supply holes 410a, the gas supply holes 420a and the gas supply holes 430a are provided from a lower portion to the upper portion of the inner tube 204. An opening area of each of the gas supply holes 410a, the gas supply holes 420a and the gas supply holes 430a is the same, and each of the gas supply holes 410a, the gas supply holes 420a and the gas supply holes 430a is provided at the same pitch. However, the gas supply holes 410a, the gas supply holes 420a and the gas supply holes 430a are not limited thereto. For example, the opening area of each of the gas supply holes 410a, the gas supply holes 420a and the gas supply holes 430a may gradually increase from the lower portion to the upper portion of the inner tube 204 to further uniformize a flow rate of the gas supplied through the gas supply holes 410a, the gas supply holes 420a or the gas supply holes 430a.

The gas supply holes 410a of the nozzle 410, the gas supply holes 420a of the nozzle 420 and the gas supply holes 430a of the nozzle 430 are provided from a lower portion to an upper portion of the boat 217 described later. Therefore, the process gas supplied into the process chamber 201 through the gas supply holes 410a of the nozzle 410, the gas supply holes 420a of the nozzle 420 and the gas supply holes 430a of the nozzle 430 can be supplied onto the wafers 200 accommodated in the boat 217 from the lower portion to the upper portion thereof, that is, an entirety of the wafers 200 accommodated in the boat 217. The nozzles 410, 420 and 430 may extend from the lower region to the upper region of the process chamber 201. However, it is preferable that the nozzles 410, 420 and 430 may extend to the vicinity of a ceiling of the boat 217.

A source gas containing a metal element (which is a metal-containing gas) serving as the process gas is supplied into the process chamber 201 through the gas supply pipe 310 provided with the MFC 312 and the valve 314 and the nozzle 410. As a source material of the source gas, for example, the source gas contains tungsten (W) serving as the metal element. For example, as the source material, tungsten fluoride (WF6) serving as a halogen-based source (which is a halide or a halogen-based tungsten source material) may be used.

A reducing gas serving as the process gas is supplied into the process chamber 201 through the gas supply pipe 320 provided with the MFC 322 and the valve 324 and the nozzle 420. As the reducing gas, for example, a gas such as a gas containing hydrogen (H) and a gas containing silicon (Si) and hydrogen and free of halogen may be used. As the reducing gas, for example, a silane-based gas such as hydrogen ($H_2$) gas, monosilane ($SiH_4$) gas and disilane ($Si_2H_6$) gas may be used. The silane-based gas described above acts as a reducing agent. In addition, the silane-based gas described above is flammable, and may also be referred to as a "flammable gas".

A reactive gas serving as the process gas and reacting with the source gas is supplied into the process chamber 201 through the gas supply pipe 330 provided with the MFC 332 and the valve 334 and the nozzle 430. As the reactive gas, for example, a nitrogen-containing gas containing nitrogen (N) such as ammonia ($NH_3$) gas may be used.

The inert gas such as nitrogen ($N_2$) gas is supplied into the process chamber 201 through the gas supply pipes 510, 520 and 530 provided with the MFCs 512, 522 and 532 and the valves 514, 524 and 534, respectively, and the nozzles 410, 420 and 430. While the present embodiments will be described by way of an example in which the $N_2$ gas is used as the inert gas, the inert gas according to the present embodiments is not limited thereto. For example, instead of the $N_2$ gas, a rare gas such as argon (Ar) gas, helium (He) gas, neon (Ne) gas and xenon (Xe) gas may be used as the inert gas.

A process gas supplier (also referred to as a process gas supply structure or a process gas supply system) is constituted mainly by the gas supply pipes 310 and 320, the MFCs 312 and 322, the valves 314 and 324 and the nozzles 410 and 420. However, only the nozzles 410 and 420 may be considered as the process gas supplier. The process gas supplier may also be simply referred to as a "gas supplier" (which is a gas supply structure or a gas supply system).

When the source gas is supplied through the gas supply pipe 310, a source gas supplier (which is a source gas supply structure or a source gas supply system) is constituted mainly by the gas supply pipe 310, the MFC 312 and the valve 314. The source gas supplier may further include the nozzle 410. In addition, when the reducing gas is supplied through the gas supply pipe 320, a reducing gas supplier (which is a reducing gas supply structure or a reducing gas supply system) is constituted mainly by the gas supply pipe 320, the MFC 322 and the valve 324. The reducing gas supplier may further include the nozzle 420. In addition, an inert gas supplier (which is an inert gas supply structure or an inert gas supply system) is constituted mainly by the gas supply pipes 510 and 520, the MFCs 512 and 522 and the valves 514 and 524. In addition, the process gas supplier may further include the gas supply pipe 330, the MFC 332 and the valve 334. The process gas supplier may further include one or more gas supply pipes, one or more MFCs, and one or more valves appropriately depending on the number of types of gases used to form a film. When the reactive gas is supplied through the gas supply pipe 330, a reactive gas supplier (which is a reactive gas supply structure or a reactive gas supply system) is constituted mainly by the gas supply pipe 330, the MFC 332 and the valve 334. The reactive gas supplier may further include the nozzle 430. When the nitrogen-containing gas serving as the reactive gas is supplied through the gas supply pipe 330, the reactive gas supplier may also be referred to as a nitrogen-containing gas supplier (which is a nitrogen-containing gas supply structure or a nitrogen-containing gas supply system). In addition, the inert gas supplier may further include the gas supply pipe 530, the MFC 532 and valve 534. In addition, the process gas supplier according to the present embodiments of the present disclosure may be constituted by a configuration through which the reactive gas (or the reducing gas) alone is supplied. Specifically, the process gas supplier may be constituted by the nozzle 420, or may be constituted by the configuration (that is, the reducing gas supplier) through which the reducing gas is supplied to the nozzle 420.

According to the present embodiments, the gas is supplied through the nozzles 410 and 420 provided in a vertically long annular space (which is defined by the inner wall of the inner tube 204 and edges (peripheries) of the wafers 200) in the spare chamber 201a. Then, the gas is ejected into the inner tube 204 through the gas supply holes 410a of the nozzle 410 and the gas supply holes 420a of the nozzle 420 provided at the positions facing the wafers 200. More specifically, the gas such as the source gas and the reducing gas is ejected into the inner tube 204 in a direction parallel to surfaces of the wafers 200 through the gas supply holes 410a of the nozzle 410 and the gas supply holes 420a of the nozzle 420.

An exhaust hole (exhaust port) 204a is a through-hole facing the nozzles 410 and 420, and is provided at a side wall of the inner tube 204. For example, the exhaust hole 204a may be of a narrow slit-shaped through-hole elongating vertically. The gas supplied into the process chamber 201 through the gas supply holes 410a of the nozzle 410 and the gas supply holes 420a of the nozzle 420 flows over the surfaces of the wafers 200. Then, the gas that has flowed over the surfaces of the wafers 200 is exhausted through the exhaust hole 204a into an exhaust path 206 which is formed by a gap provided between the inner tube 204 and the outer tube 203. Then, the gas flowing in the exhaust path 206 flows into an exhaust pipe 231 and is then discharged (exhausted) out of the process furnace 202.

The exhaust hole 204a is provided at a location facing the wafers 200. The gas supplied in the vicinity of the wafers 200 in the process chamber 201 through the gas supply holes 410a and the gas supply holes 420a flows in a horizontal direction. The gas that has flowed in the horizontal direction is exhausted through the exhaust hole 204a into the exhaust path 206. The exhaust hole 204a is not limited to the slit-shaped through-hole. For example, the exhaust hole 204a may be configured as a plurality of holes.

The exhaust pipe 231 through which an inner atmosphere of the process chamber 201 is exhausted is installed at the manifold 209. A pressure sensor 245 serving as a pressure detector (pressure detecting structure) configured to detect an inner pressure of the process chamber 201, an APC (Automatic Pressure Controller) valve 243 and a vacuum pump 246 serving as a vacuum exhaust apparatus are sequentially connected to the exhaust pipe 231 in this order from an upstream side to a downstream side of the exhaust pipe 231. With the vacuum pump 246 in operation, the APC valve 243 may be opened or closed to perform a vacuum exhaust of the process chamber 201 or stop the vacuum exhaust. In addition, with the vacuum pump 246 in operation, an opening degree of the APC valve 243 may be adjusted in order to adjust the inner pressure of the process chamber 201. An exhauster (also referred to as an exhaust structure or an exhaust system) is constituted mainly by the exhaust hole 204a, the exhaust path 206, the exhaust pipe 231, the APC valve 243 and the pressure sensor 245. The exhauster may further include the vacuum pump 246.

A seal cap 219 serving as a furnace opening lid capable of airtightly sealing a lower end opening of the manifold 209 is provided under the manifold 209. The seal cap 219 is in contact with the lower end of the manifold 209 from thereunder. For example, the seal cap 219 is made of a metal such as SUS, and is of a disk shape. An O-ring 220b serving as a seal is provided on an upper surface of the seal cap 219 so as to be in contact with the lower end of the manifold 209. A rotator 267 configured to rotate the boat 217 accommodating the wafers 200 is provided at the seal cap 219 opposite to the process chamber 201. A rotating shaft 255 of the rotator 267 is connected to the boat 217 through the seal cap 219. As the rotator 267 rotates the boat 217, the wafers 200 accommodated in the boat 217 are rotated. The seal cap 219 may be elevated or lowered in the vertical direction by a boat elevator 115 serving as an elevating structure vertically provided outside the outer tube 203. When the seal cap 219 is elevated or lowered in the vertical direction by the boat elevator 115, the boat 217 may be transferred (loaded) into the process chamber 201 or transferred (unloaded) out of the process chamber 201. The boat elevator 115 serves as a transfer device (which is a transfer structure or a transfer system) that loads the boat 217 and the wafers 200 accommodated in the boat 217 into the process chamber 201 or unloads the boat 217 and the wafers 200 accommodated in the boat 217 out of the process chamber 201.

The boat 217 serving as a substrate retainer is configured to accommodate (support) the wafers 200 (for example, 25 wafers to 200 wafers) while the wafers 200 are horizontally oriented with their centers aligned with each other with a predetermined interval therebetween in the vertical direction. For example, the boat 217 is made of a heat resistant material such as quartz and SiC. A plurality of heat insulating plates including a heat insulating plate 218 horizontally oriented are provided under the boat 217 in a multistage manner (not shown). The heat insulating plate 218 is made of a heat resistant material such as quartz and SiC. With such a configuration, the heat insulating plate 218 suppresses the transmission of the heat from the heater 207 to the seal cap 219. However, the present embodiments are not limited thereto. For example, instead of the heat insulating plate 218, a heat insulating cylinder (not shown) such as a cylinder made of a heat resistant material such as quartz and SiC may be provided under the boat 217.

Figure 2:
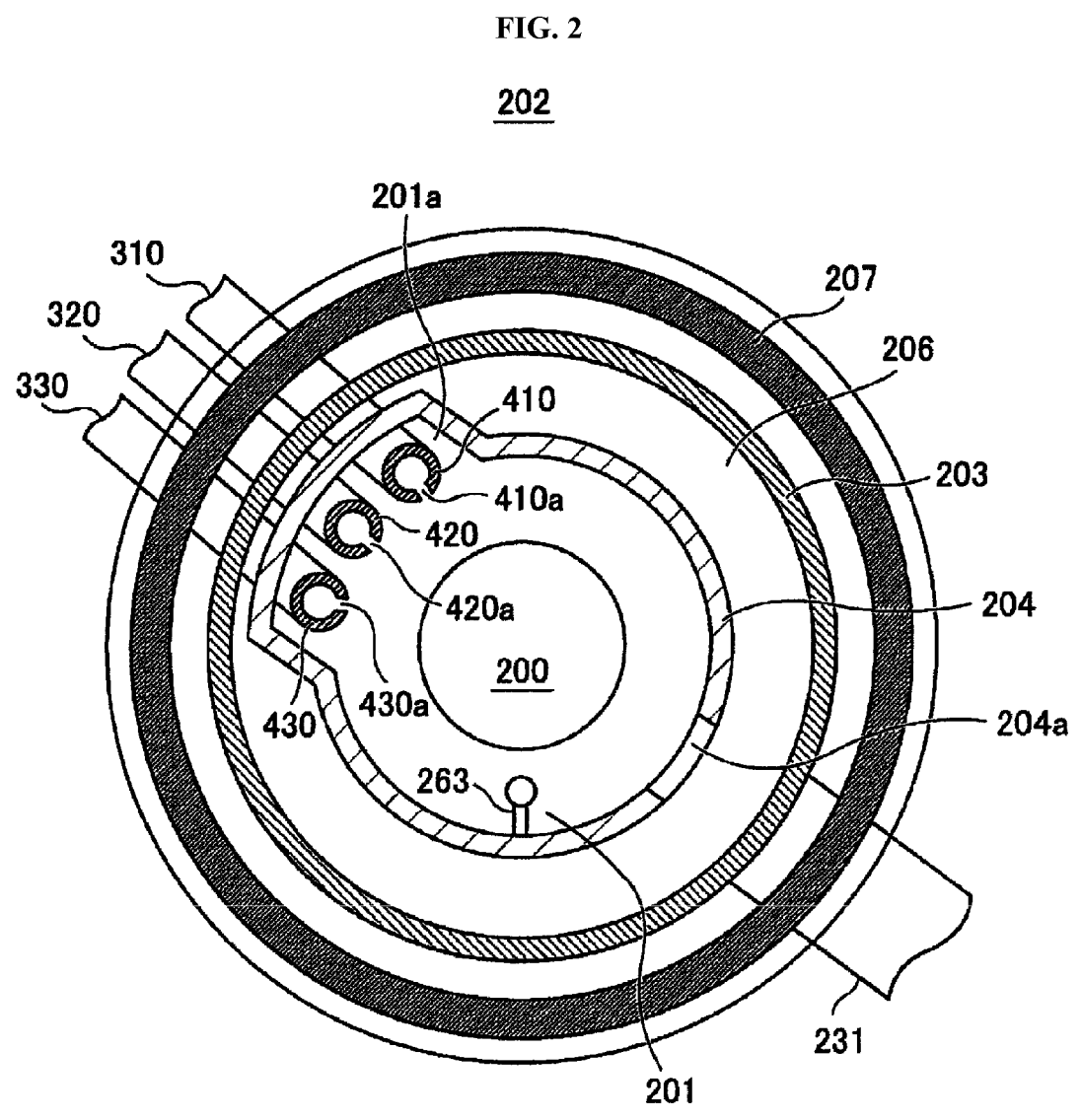

As shown in FIG. 2, a temperature sensor 263 serving as a temperature detector is installed in the inner tube 204. An amount of the current supplied to the heater 207 is adjusted based on temperature information detected by the temperature sensor 263 such that a desired temperature distribution of an inner temperature of the process chamber 201 can be obtained. Similar to the nozzles 410, 420 and 430, the temperature sensor 263 is L-shaped, and is provided along the inner wall of the inner tube 204.

Figure 3:
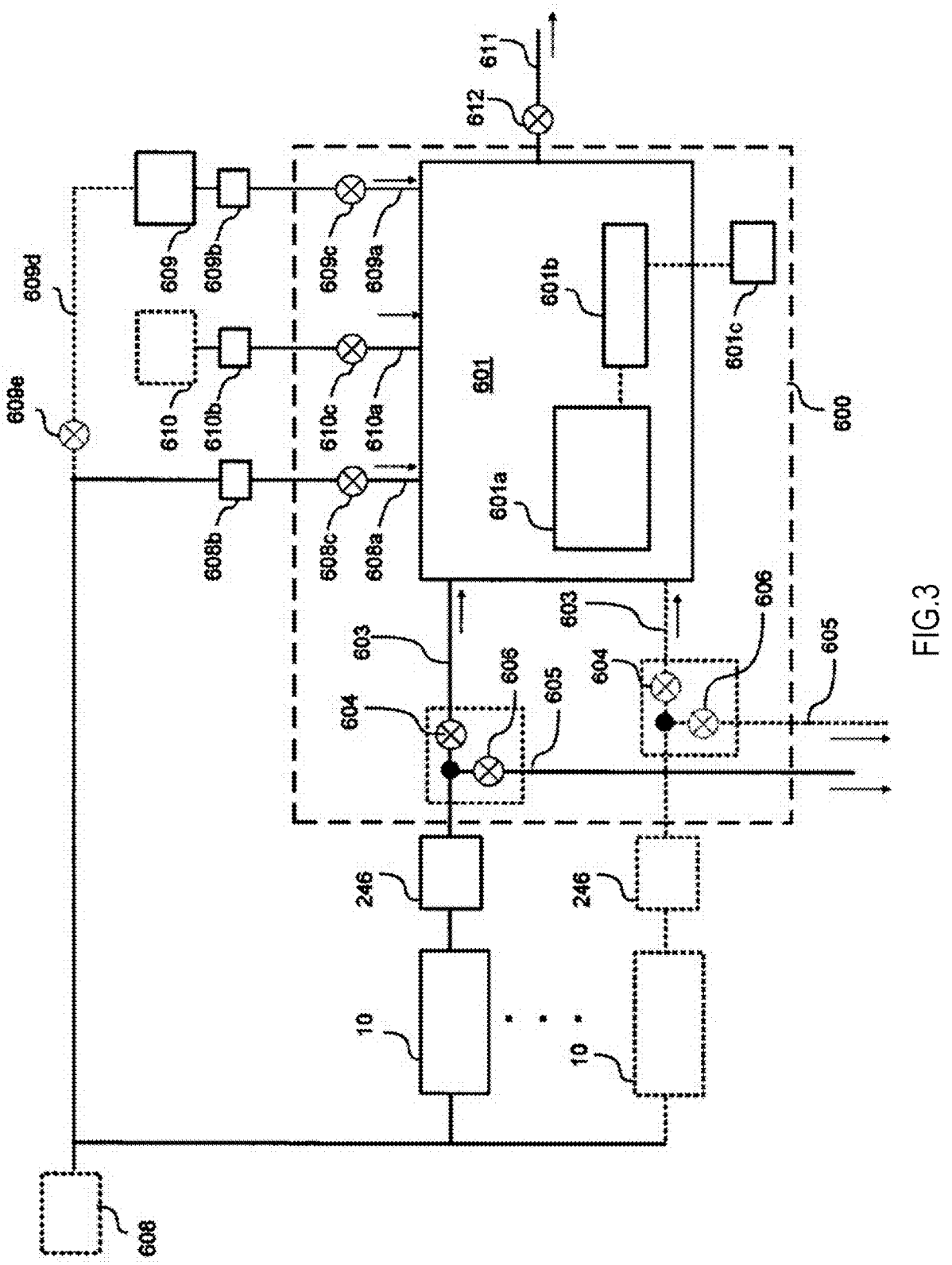
FIG. 3 is a diagram schematically illustrating the substrate processing apparatus and an exhaust gas processing system.
Figure 8:
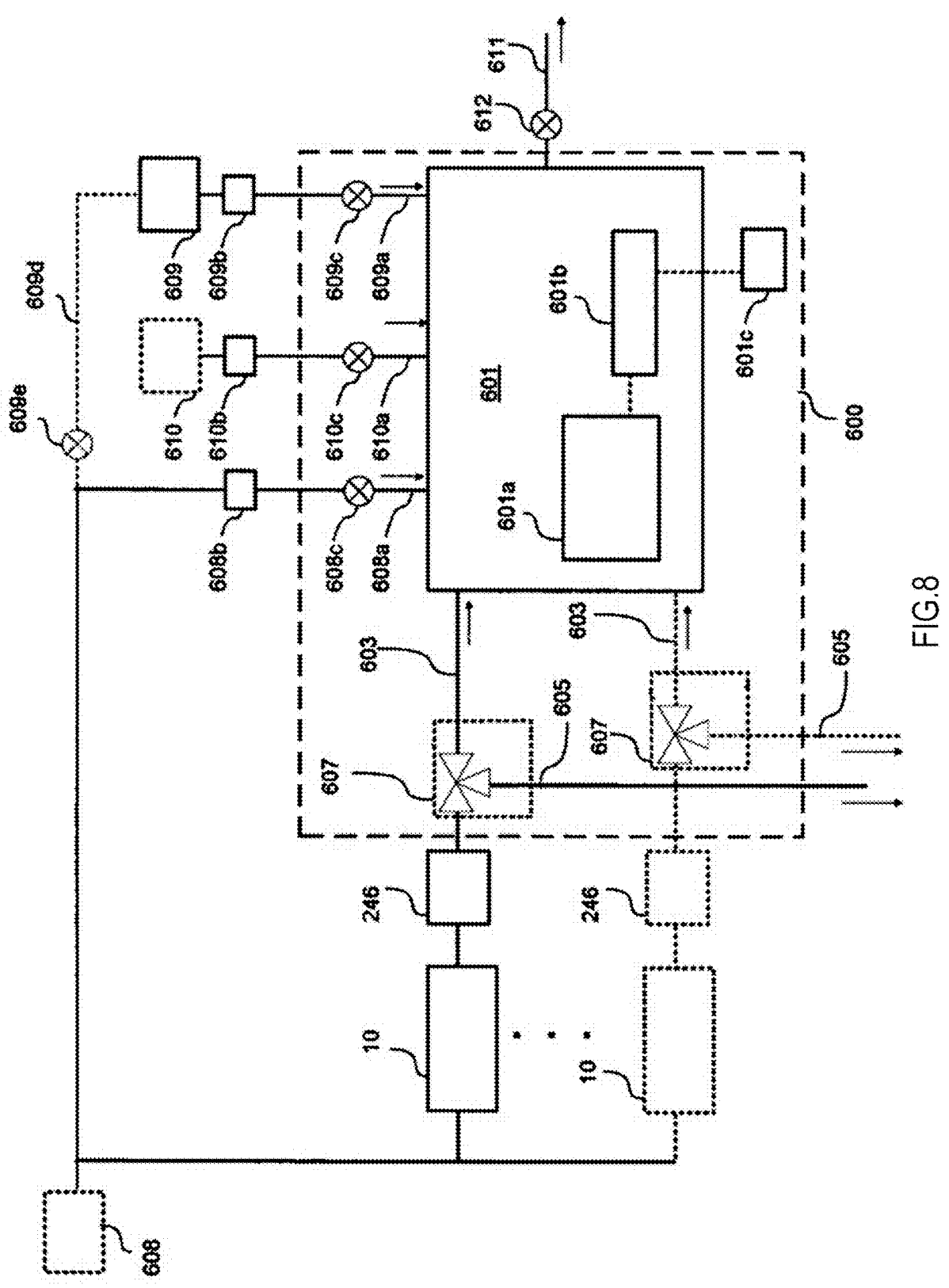
FIG. 8 is another diagram schematically illustrating the substrate processing apparatus and the exhaust gas processing system.

As shown in FIG. 3, an exhaust gas processing system 600 including an exhaust gas process chamber 601 is connected to a downstream side of the vacuum pump 246 connected to the exhauster of the substrate processing apparatus 10. The vacuum pump 246 and the exhaust gas process chamber 601 are connected by an exhaust pipe 603. A valve 604 serving as a first valve is provided at the exhaust pipe 603 at an upstream side of the exhaust pipe 603 (that is, a portion of the exhaust pipe 603 adjacent to vacuum pump 246). In addition, a bypass exhaust pipe 605 through which an exhaust gas is bypassed and exhausted to an equipment exhaust system (not shown) is connected to the exhaust pipe 603 at an upstream side of the valve 604. A valve 606 serving as a second valve is provided at the bypass exhaust pipe 605. Instead of configuring the valve 604 and the valve 606 as separate valves, the valve 604 and the valve 606 may be configured by a single valve, that is, a three-way valve 607 as shown in FIG. 8. The exhaust gas of the substrate processing apparatus 10 is supplied (exhausted) to the exhaust gas process chamber 601 through the vacuum pump 246, the valve 604 and the exhaust pipe 603.

The exhaust gas process chamber 601 may be configured such that the exhaust gas of a plurality of substrate processing apparatuses including the substrate processing apparatus 10 can be supplied to the exhaust gas process chamber 601. When the exhaust gas of the plurality of substrate processing apparatuses including the substrate processing apparatus 10 are provided, the number of a configuration described above such as the exhaust pipe 603, the valves 604 and 606 and the bypass exhaust pipe 605 may increase in accordance with an increase of the number of the plurality of substrate processing apparatuses including the substrate processing apparatus 10 as shown by a dotted line in FIG. 3.

Exhaust Gas Processing System

The exhaust gas processing system 600 is provided with at least the exhaust gas process chamber 601. The exhaust gas process chamber 601 is provided with a processing structure 601*a* capable of detoxifying the exhaust gas supplied to the exhaust gas process chamber 601 and a detector 601*b* capable of detecting an operation of the processing structure 601*a*. Further, the detector 601*b* is configured to be capable of transmitting data (measured value) detected thereby to an exhaust gas controller 601*c* or a controller 121 described later. According to the present embodiments, the processing structure 601*a* is configured as an electrode capable of generating a flame or plasma or as a heating source in the exhaust gas process chamber 601. The detector 601*b* is configured as a component such as a flame sensor, an optical sensor and a matching box, and is configured to be capable of detecting whether or not a process (that is, a detoxification process) is performed in the exhaust gas process chamber 601. Specifically, for example, by detecting a light or an electric power applied to the electrode, the detector 601*b* is configured to be capable of measuring whether or not the flame or the plasma is generated.

The exhaust gas process chamber 601 is configured such that the N$_2$ gas serving as the inert gas can be supplied from each of a first inert gas supply source 608 capable of supplying the N$_2$ gas serving as a first inert gas and a second inert gas supply source 609 capable of supplying the N$_2$ gas serving as a second inert gas. According to the present embodiments, the first inert gas supply source 608 may refer to a nitrogen (N$_2$) gas line provided in an equipment of a manufacturing factory of a semiconductor device, and the second inert gas supply source 609 may refer to a nitrogen (N$_2$) gas cylinder or a tank capable of storing the N$_2$ gas provided in either or both of the substrate processing apparatus 10 and the exhaust gas processing system 600. The first inert gas supply source 608 and the exhaust gas process chamber 601 are connected by a gas supply pipe 608*a*. An MFC 608*b* and a valve 608*c* are sequentially provided at the gas supply pipe 608*a* in this order from an upstream side to a downstream side of the gas supply pipe 608*a*. According to the present embodiments, a first inert gas supplier (which is a first inert gas supply structure or a first inert gas supply system) is constituted mainly by the gas supply pipe 608*a*, the MFC 608*b* and the valve 608*c*. The second inert gas supply source 609 and the exhaust gas process chamber 601 are connected by a gas supply pipe 609*a*. A flow rate regulator (which is a flow rate adjusting structure) 609*b* and a valve 609*c* are sequentially provided at the gas supply pipe 609*a* in this order from an upstream side to a downstream side of the gas supply pipe 609*a*. The flow rate regulator 609*b* is embodied by one of an MFC, a needle valve and an orifice. Preferably, the flow rate regulator 609*b* is embodied by one of the needle valve and the orifice. More preferably, the flow rate regulator 609*b* is embodied by the orifice. Since the flow rate adjusting structure such as the needle valve and the orifice can adjust a flow rate without using the electric power or a compressed air, even when the electric power or the compressed air cannot be supplied for some reason, it is possible to supply the inert gas to the exhaust gas process chamber 601. According to the present embodiments, a second inert gas supplier (which is a second inert gas supply structure or a second inert gas supply system) is constituted mainly by the gas supply pipe 609*a*, the flow rate regulator 609*b* and the valve 609*c*.

In addition, when the second inert gas supply source 609 is configured as the tank capable of storing the inert gas, as shown by a dotted line in FIG. 3, the first inert gas supply source 608 and the second inert gas supply source 609 are connected to a gas supply pipe 609*d*, and a valve 609*e* is provided at the gas supply pipe 609*d* such that the inert gas can be supplied from the first inert gas supply source 608 to the second inert gas supply source 609. In such a case, for example, the inert gas may be stored in the second inert gas supply source 609 before a process (that is, a substrate processing) is performed by the substrate processing apparatus 10.

In addition, the exhaust gas process chamber 601 is configured such that an additive gas capable of promoting an exhaust gas processing can be supplied. According to the present embodiments, the "additive gas" refers to a gas capable of promoting the combustion or a generation of the plasma. As the gas capable of promoting the combustion, for example, at least one among propane (C$_3$H$_8$) gas, hydrogen (H$_2$) gas, oxygen (O$_2$) gas, dry air and the like may be used. Mainly, the propane gas is used as the gas capable of promoting the combustion. Preferably, a different type of gas from the reducing gas may be used. As the gas capable of promoting the generation of the plasma, a rare gas such as argon (Ar) gas, helium (He) gas and neon (Ne) gas may be used. The additive gas is supplied from an additive gas supply source 610 to the exhaust gas process chamber 601 through a gas supply pipe 610*a*. An MFC 610*b* and a valve 610*c* are sequentially provided at the gas supply pipe 610*a* in this order from an upstream side to a downstream side of the gas supply pipe 610*a*.

An exhaust pipe 611 through which the exhaust gas processed in the exhaust gas process chamber 601 is exhausted is connected to the exhaust gas process chamber 601 such that the exhaust gas can be exhausted to an exhaust equipment of the manufacturing factory of the semiconductor device. A valve 612 is provided at the exhaust pipe 611.

The exhaust gas processing system 600 is constituted by at least the exhaust gas process chamber 601, the exhaust pipes 603 and 611, the bypass exhaust pipe 605 and the valves 604, 606, 608*c*, 609*c* and 612. The exhaust gas processing system 600 may further include other components described above with respect to the exhaust gas processing system 600.

Figure 4:
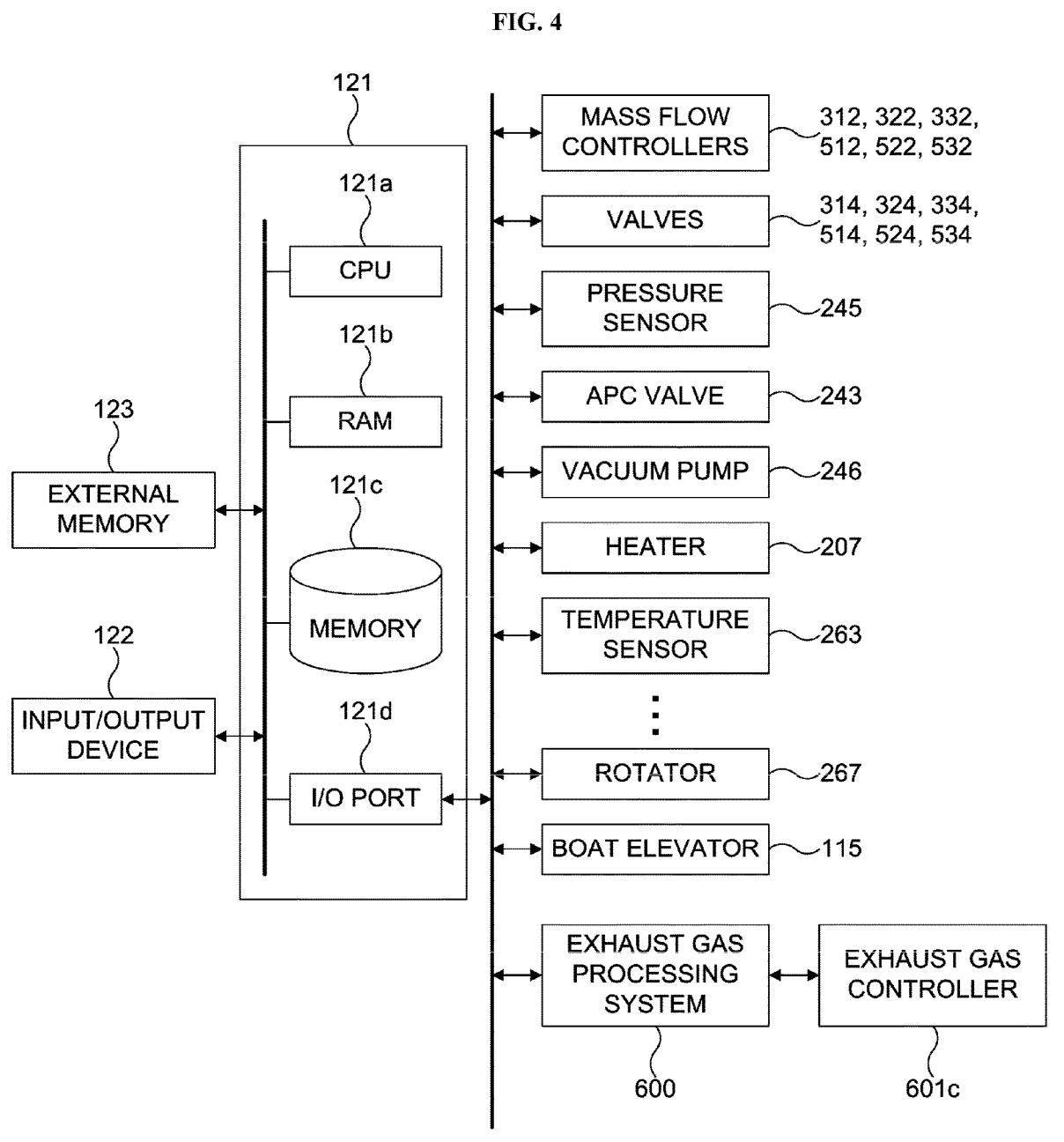

As shown in FIG. 4, the controller 121 serving as a control device (control structure) is constituted by a computer including a CPU (Central Processing Unit) 121*a*, a RAM (Random Access Memory) 121*b*, a memory 121*c* and an I/O port 121*d*. The RAM 121*b*, the memory 121*c* and the I/O port 121*d* may exchange data with the CPU 121*a* through an internal bus. For example, an input/output device 122 such as a touch panel configured to input and output data is connected to the controller 121.

The memory 121*c* is configured by a component such as a flash memory and a hard disk drive (HDD). For example, a control program configured to control the operation of the substrate processing apparatus 10 or a process recipe containing information on sequences and conditions of a method of manufacturing a semiconductor device described later is readably stored in the memory 121*c*. The process recipe is obtained by combining steps (processes) of the method of manufacturing the semiconductor device described later such that the controller 121 can execute the steps to acquire a predetermined result, and functions as a program. Hereafter, the process recipe and the control program may be collectively or individually referred to as a "program". In the present specification, the term "program" may refer to the process recipe alone, may refer to the control program alone, or may refer to a combination of the process recipe and the control program. The RAM 121*b* functions as a memory area (work area) where a program or data read by the CPU 121*a* is temporarily stored.

The I/O port 121*d* is connected to the above-described components such as the MFCs 312, 322, 332, 512, 522 and 532, the valves 314, 324, 334, 514, 524 and 534, the pressure sensor 245, the APC valve 243, the vacuum pump 246, the heater 207, the temperature sensor 263, the rotator 267, the boat elevator 115 and the exhaust gas processing system 600. In addition, the exhaust gas processing system 600 is configured to be capable of being connected to the exhaust gas controller 601*c*.

The CPU 121*a* is configured to read the control program from the memory 121*c* and execute the read control program. In addition, the CPU 121*a* is configured to read a recipe such as the process recipe from the memory 121*c* in accordance with an operation command inputted from the input/output device 122. According to the contents of the read recipe, the CPU 121*a* may be configured to be capable of controlling various operations such as flow rate adjusting operations for various gases by the MFCs 312, 322, 332, 512, 522 and 532, opening and closing operations of the valves 314, 324, 334, 514, 524 and 534, an opening and closing operation of the APC valve 243, a pressure adjusting operation by the APC valve 243 based on the pressure sensor 245, a temperature adjusting operation by the heater 207 based on the temperature sensor 263, a start and stop of the vacuum pump 246, an operation of adjusting the rotation and the rotation speed of the boat 217 by the rotator 267, an elevating and lowering operation of the boat 217 by the boat elevator 115 and an operation of transferring and accommodating the wafer 200 into the boat 217. In addition, the CPU 121*a* or the exhaust gas controller 601*c* may be configured to be capable of controlling various operations such as a processing operation by the processing structure 601*a* in the exhaust gas processing system 600, a detecting operation by the detector 601*b*, flow rate adjusting operations for various gases by the MFCs 608*b* and 610*b* and the flow rate regulator 609*b* based on the detection of the detector 601*b* and opening and closing operations of the valves 604, 606, 608*c*, 609*c*, 610*c* and 612.

The controller 121 may be embodied by installing the above-described program stored in an external memory 123 into a computer. For example, the external memory 123 may include a magnetic tape, a magnetic disk such as a flexible disk and a hard disk, an optical disk such as a CD and a DVD, a magneto-optical disk such as an MO and a semiconductor memory such as a USB memory and a memory card. The memory 121*c* or the external memory 123 may be embodied by a non-transitory computer readable recording medium. Hereafter, the memory 121*c* and the external memory 123 are collectively or individually referred to as a "recording medium". In the present specification, the term "recording medium" may refer to the memory 121*c* alone, may refer to the external memory 123 alone, and may refer to both of the memory 121*c* and the external memory 123. Instead of the external memory 123, a communication means such as the Internet and a dedicated line may be used for providing the program to the computer.

(2) Substrate Processing (Film-Forming Process)

Figure 5:
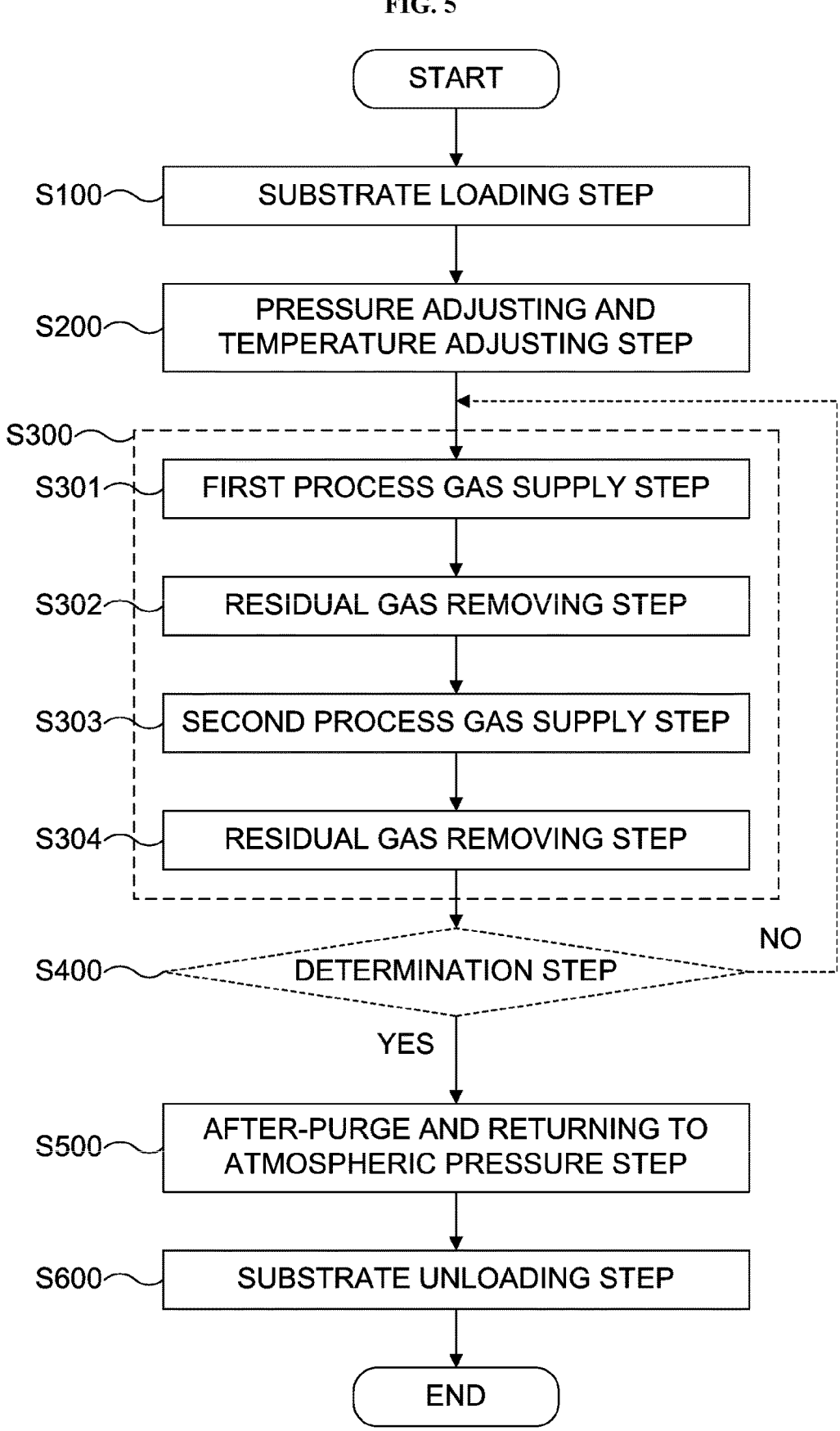
FIG. 5 is a flowchart schematically illustrating a substrate processing according to the embodiments of the present disclosure.

Hereinafter, as a part of a manufacturing process of the semiconductor device, an example of the substrate processing of forming a film (for example, a metal film constituting a gate electrode) on the wafers 200 will be described with reference to FIG. 5. The substrate processing of forming the metal film is performed using the process furnace 202 of the substrate processing apparatus 10 described above. In the following description, the operations of the components constituting the substrate processing apparatus 10 are controlled by the controller 121.

In the present specification, the term "wafer" may refer to "a wafer itself", or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself", or may refer to "a surface of a predetermined layer or a film formed on a wafer". In the present specification, the terms "substrate" and "wafer" may be used as substantially the same meaning. That is, the term "substrate" may be substituted by "wafer" and vice versa.

Substrate Loading Step: S100

The wafers 200 are charged (transferred) into the boat 217 (wafer charging step). After the boat 217 is charged with the wafers 200, as shown in FIG. 1, the boat 217 charged with the wafers 200 is elevated by the boat elevator 115 and loaded (transferred) into the process chamber 201 (boat loading step). With the boat 217 loaded, the seal cap 219 seals a lower end opening of the outer tube 203 (that is, the lower end opening of the manifold 209) via the O-ring 220*b*.

Pressure Adjusting and Temperature Adjusting Step: S200

The vacuum pump 246 vacuum-exhausts the inner atmosphere of the process chamber 201 until the inner pressure of the process chamber 201 reaches and is maintained at a desired pressure (vacuum degree). When the vacuum pump 246 vacuum-exhausts the inner atmosphere of the process chamber 201, the inner pressure of the process chamber 201 is measured by the pressure sensor 245, and the APC valve 243 is feedback-controlled based on pressure information measured by the pressure sensor 245 (pressure adjusting step). The vacuum pump 246 continuously vacuum-exhausts the inner atmosphere of the process chamber 201 until at least a processing (that is, the substrate processing) of the wafer 200 is completed. In addition, the heater 207 heats the process chamber 201 until the inner temperature of the process chamber 201 reaches and is maintained at a desired temperature. When the heater 207 heats the process chamber 201, the amount of the current supplied to the heater 207 is feedback-controlled based on the temperature information detected by the temperature sensor 263 such that the desired temperature distribution of the inner temperature of the process chamber 201 is obtained (temperature adjusting step). The heater 207 continuously heats the process chamber 201 until at least the processing of the wafer 200 is completed.

Film-Forming Step: S300

Figure 6:
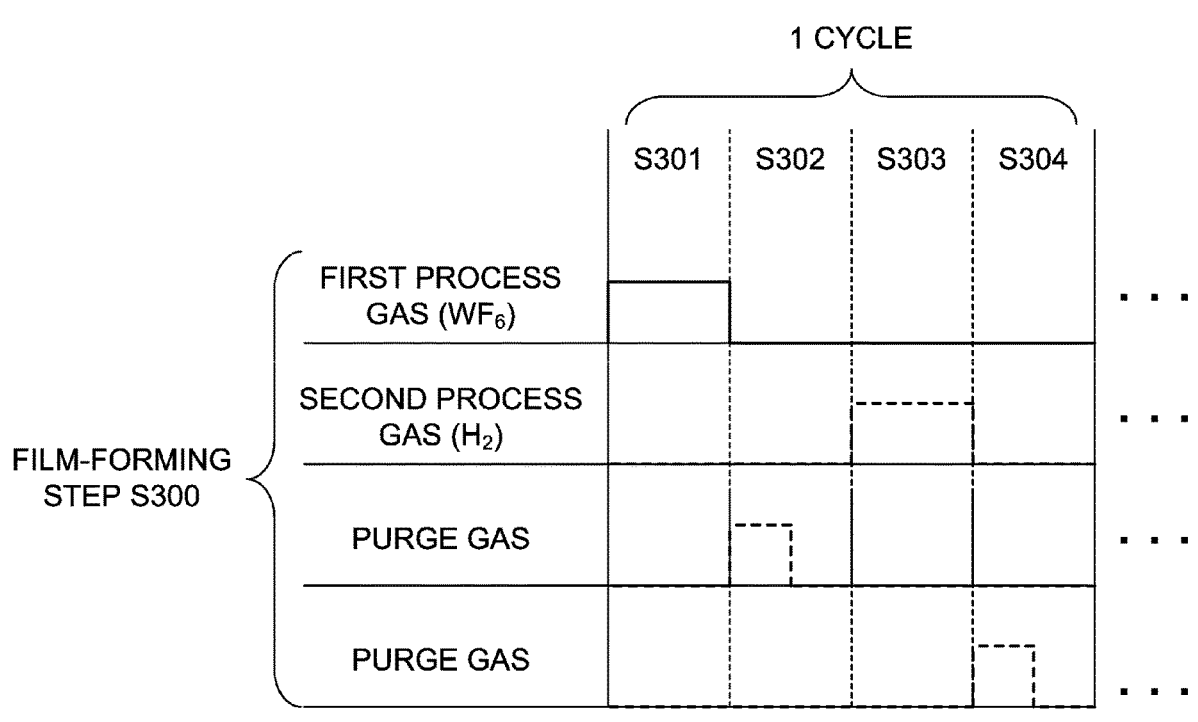
FIG. 6 is a diagram schematically illustrating a gas supply timing of the substrate processing according to the embodiments of the present disclosure.

Subsequently, as a film-forming step S300, a step of forming the metal film is performed on the wafer 200. The present embodiments will be described by way of an example in which a tungsten (W) film is formed as the metal film. The film-forming step S300 will be described with reference to FIGS. 5 and 6.

First Process Gas Supply Step: S301

First, a first process gas supply step S301 is performed. The valve 314 is opened to supply the source gas serving as a first process gas into the gas supply pipe 310. According to the present embodiments, the $WF_6$ gas is used as the source gas. A flow rate of the $WF_6$ gas supplied into the gas supply pipe 310 is adjusted by the MFC 312. The $WF_6$ gas whose flow rate is adjusted is then supplied into the process chamber 201 through the gas supply holes 410*a* of the nozzle 410, and is exhausted through the exhaust pipe 231. Thereby, the $WF_6$ gas is supplied to the wafers 200. When the $WF_6$ gas is supplied, simultaneously, the valve 514 may be opened to supply the inert gas such as the $N_2$ gas into the gas supply pipe 510. A flow rate of the $N_2$ gas supplied into the gas supply pipe 510 is adjusted by the MFC 512. The $N_2$ gas whose flow rate is adjusted is then supplied into the process chamber 201 together with the $WF_6$ gas, and is exhausted through the exhaust pipe 231. In addition, in order to prevent the $WF_6$ gas from entering the nozzles 420 and 430, the valves 524 and 534 may be opened to supply the $N_2$ gas into the gas supply pipes 520 and 530. The $N_2$ gas is then supplied into the process chamber 201 through the gas supply pipes 320 and 330, the nozzles 420 and 430, and is exhausted through the exhaust pipe 231.

In the first process gas supply step S301, for example, the APC valve 243 is appropriately adjusted (controlled) to adjust the inner pressure of the process chamber 201 to a pressure within a range from 1 Pa to 3,990 Pa, preferably from 5 Pa to 2,660 Pa, and more preferably from 10 Pa to 1,500 Pa. For example, a supply flow rate of the $WF_6$ gas controlled by the MFC 312 may be set to a flow rate within a range from 0.01 slm to 10.0 slm, preferably from 0.3 slm to 3 slm, and more preferably from 0.5 slm to 2 slm. For example, supply flow rates of the $N_2$ gas controlled by the MFCs 512, 522 and 532, respectively, may be set to flow rates within a range from 0.01 slm to 20 slm, preferably from 0.1 slm to 10 slm, and more preferably from 0.1 slm to 1 slm, respectively. In the first process gas supply step S301, for example, a temperature of the heater 207 may be set such that a temperature of the wafer 200 reaches and is maintained at a temperature within a range from 250° C. to 600° C.

In the first process gas supply step S301, the $WF_6$ gas and the $N_2$ gas are supplied into the process chamber 201 without any other gas being supplied into the process chamber 201 together with the $WF_6$ gas and the $N_2$ gas. By supplying the $WF_6$ gas, a tungsten-containing layer is formed on the wafer 200 (that is, on a base film on the surface of the wafer 200). The tungsten-containing layer may refer to a tungsten layer containing fluorine (F), may refer to an adsorption layer of the $WF_6$, or may refer to both of the tungsten layer containing fluorine and the adsorption layer of the $WF_6$.

Residual Gas Removing Step: S302

After the tungsten-containing layer is formed, the valve 314 is closed to stop a supply of the $WF_6$ gas. In the residual gas removing step S302, with the APC valve 243 of the exhaust pipe 231 open, the vacuum pump 246 vacuum-exhausts the inner atmosphere of the process chamber 201 to remove a residual gas in the process chamber 201 such as the $WF_6$ gas remaining in the process chamber 201 which did not react or which contributed to the formation of the tungsten-containing layer out of the process chamber 201. In the residual gas removing step S302, with the valves 514, 524 and 534 open, the $N_2$ gas is continuously supplied into the process chamber 201. The $N_2$ gas serves as a purge gas, which improves the efficiency of removing the $WF_6$ gas remaining in the process chamber 201 which did not react or which contributed to the formation of the tungsten-containing layer out of the process chamber 201.

Second Process Gas Supply Step: S303

Subsequently, a second process gas supply step S303 of supplying the reactive gas serving as a second process gas is performed. According to the present embodiments, hydrogen ($H_2$) gas may be used as the reactive gas. In addition, as the second process gas, a gas which is reducible or flammable may be usually used. In the second process gas supply step S303, the valve 324 is opened to supply the $H_2$ gas serving as the reducing gas (that is, the second process gas) into the gas supply pipe 320. A flow rate of the $H_2$ gas supplied into the gas supply pipe 320 is adjusted by the MFC 322. The $H_2$ gas whose flow rate is adjusted is then supplied into the process chamber 201 through the gas supply holes 420*a* of the nozzle 420, and is exhausted through the exhaust pipe 231. Thereby, the $H_2$ gas is supplied to the wafers 200. When the $H_2$ gas is supplied, simultaneously, the valve 524 may be opened to supply the inert gas such as the $N_2$ gas into the gas supply pipe 520. A flow rate of the $N_2$ gas supplied into the gas supply pipe 520 is adjusted by the MFC 522. The $N_2$ gas whose flow rate is adjusted is then supplied into the process chamber 201 together with the $H_2$ gas, and is exhausted through the exhaust pipe 231. In addition, in order to prevent the $H_2$ gas from entering the nozzles 410 and 430, the valves 514 and 534 may be opened to supply the $N_2$ gas into the gas supply pipes 510 and 530. The $N_2$ gas is then supplied into the process chamber 201 through the gas supply pipes 310 and 330, the nozzles 410 and 430, and is exhausted through the exhaust pipe 231.

In the second process gas supply step S303, for example, the APC valve 243 is appropriately adjusted (controlled) to adjust the inner pressure of the process chamber 201 to a pressure within a range from 1 Pa to 3,990 Pa. For example, a supply flow rate of the $H_2$ gas controlled by the MFC 322 may be set to a flow rate within a range from 0.1 slm to 50.0 slm. For example, the supply flow rates of the $N_2$ gas controlled by the MFCs 512, 522 and 532, respectively, may be set to flow rates within a range from 0.1 slm to 20 slm. For example, a supply time (time duration) of supplying the $H_2$ gas to the wafer 200 may be set to a time within a range from 0.1 second to 20 seconds. In the second process gas supply step S303, for example, the temperature of the heater 207 may be set such that the temperature of the wafer 200 reaches and is maintained at a temperature within a range from 200° C. to 600° C. In the second process gas supply step S303, the $H_2$ gas and the $N_2$ gas are supplied into the process chamber 201 without any other gas being supplied into the process chamber 201 together with the $H_2$ gas and the $N_2$ gas. By supplying the $H_2$ gas, a tungsten layer serving as a metal layer whose thickness is, for example, within a range from less than a single atomic layer to several atomic layers is formed on the wafer 200 (that is, on the base film on the surface of the wafer 200).

Residual Gas Removing Step: S304

After the tungsten layer is formed, the valve 324 is closed to stop a supply of the $H_2$ gas. Then, a residual gas in the process chamber 201 such as the $H_2$ gas remaining in the process chamber 201 which did not react or which contributed to the formation of the tungsten layer is removed out of the process chamber 201 in substantially the same manners as in the residual gas removing step S302.

Determination Step: S400

By performing a cycle wherein the first process gas supply step S301 through the residual gas removing step S304 described above are sequentially performed in this order at least once, that is, a predetermined number of times (n times), the tungsten film of a predetermined thickness is formed on the wafers 200. In the determination step S400, it is determined whether the cycle is performed a predetermined number of times (n times) or more. When it is determined that the cycle is performed n times or more ("YES" in FIG. 5), the film-forming step S300 is terminated. When it is determined that the cycle is performed less than n times ("NO" in FIG. 5), the cycle is performed again. In addition, it is preferable that the cycle is performed a plurality of times.

In addition, while the present embodiments are described by way of an example in which the residual gas removing steps S302 and S304 are performed, a step (process) of reacting the first process gas and the second process gas in a gas phase may be performed without performing the residual gas removing steps S302 and S304.

After-Purge and Returning to Atmospheric Pressure Step: S500

The $N_2$ gas is supplied into the process chamber 201 through each of the gas supply pipes 510, 520 and 530, and is exhausted through the exhaust pipe 231. The $N_2$ gas serves as the purge gas, and the inner atmosphere of the process chamber 201 is purged with the inert gas. Thereby, the residual gas in the process chamber 201 and reaction by-products remaining in the process chamber 201 are removed from the process chamber 201 (after-purge step). Thereafter, the inner atmosphere of the process chamber 201 is replaced with the inert gas (substitution by the inert gas), and the inner pressure of the process chamber 201 is returned to the normal pressure (atmospheric pressure) (returning to atmospheric pressure step).

Substrate Unloading Step: S600

Thereafter, the seal cap 219 is lowered by the boat elevator 115 and the lower end of the inner tube 204 is opened. Then, the boat 217 with the processed wafers 200 charged therein is unloaded out of the inner tube 204 through the lower end of the inner tube 204 (boat unloading step). Then, the processed wafers 200 are transferred (discharged) from the boat 217 (wafer discharging step).

Thereby, the substrate processing is performed. In addition, an exhaust gas processing step S700 is performed subsequently while at least the $H_2$ gas which is a flammable gas is being supplied in the substrate processing.

Exhaust Gas Processing Step: S700

The exhaust gas containing the $H_2$ gas serving as a combustible gas exhausted from the substrate processing apparatus 10 passes through the exhaust pipe 603, and is supplied to the exhaust gas process chamber 601. The exhaust gas is detoxified by the processing structure 601a of the exhaust gas process chamber 601.

Detoxification Process

The detoxification process is performed in the exhaust gas process chamber 601. According to the present embodiments, the detoxification process refers to at least one among a combustion process, a decomposition process by the plasma, a heat treatment process (a thermal decomposition process by heating), a stabilization process by binding with another element, a dilution process and a trap process (adsorption process). When the combustion process or the decomposition process by the plasma is performed, energy is given to a target gas from the processing structure 601a. When stabilization process by binding with another element is performed, an active gas is supplied to the exhaust gas process chamber 601. When the dilution process is performed, the first inert gas is supplied through the gas supply pipe 608a. The exhaust gas detoxified by the processes described above is exhausted from the exhaust gas process chamber 601 to the exhaust equipment of the manufacturing factory of the semiconductor device through the exhaust pipe 611.

According to the present embodiments, a configuration of the processing structure 601a may differ depending on contents of the detoxification process. For example, when the combustion process is performed as the detoxification process, an ignition source is used as the processing structure 601a. When the decomposition process by the plasma is performed as the detoxification process, the processing structure 601a is configured as an electrode capable of generating the plasma. When the thermal decomposition process by heating is performed as the detoxification process, the processing structure 601a is configured as a heating element (heater).

The present embodiments will be described by way of an example in which a process of burning the $H_2$ gas (that is, reacting with oxygen (O)) to generate water ($H_2O$) and detoxifying the $H_2$ gas is performed as the detoxification process. According to the present embodiments, oxygen ($O_2$) gas may be supplied as the additive gas.

Additive Gas Supply

The additive gas is continuously supplied while at least the flammable gas described above gas is supplied into the inner tube 204 in the reaction tube. According to the present embodiments, for example, propane ($C_3H_8$) gas is supplied as the additive gas. A flow rate of the propane gas is adjusted by the MFC 610b, and the propane gas whose flow rate is adjusted is then supplied to the exhaust gas process chamber 601 through the valve 610c. In addition, the flow rate of propane gas may be adjusted to a pre-set flow rate, or the flow rate of propane gas to enable the combustion may be automatically set using the MFC 610b based on the flow rate of the $H_2$ gas supplied into the inner tube 204 in the substrate processing described above. Further, the oxygen ($O_2$) gas may be added to promote the combustion. For example, a flow rate of the $O_2$ gas may be set to a flow rate such that a ratio of hydrogen to oxygen is 2:1. Such setting of the flow rate of the $O_2$ gas may be performed based on the calculation by the CPU 121a of the controller 121, and flow rate data of the $O_2$ gas may be transmitted from the controller 121 to the MFC 610b. Further, the controller 121 may be configured to transmit the flow rate data to the MFC 610b through the exhaust gas controller 601c. When the additive gas cannot be used in the detoxification process in the exhaust gas process chamber 601, the additive gas is not supplied.

Dilution Gas Supply

Then, while the detoxification process is being performed in the exhaust gas process chamber 601 and the exhaust gas is being processed (that is, the exhaust gas is subject to the detoxification process), the first inert gas is supplied to the exhaust gas process chamber 601 to dilute the exhaust gas. The first inert gas is supplied from the first inert gas supply source 608 to the exhaust gas process chamber 601 through the gas supply pipe 608a, the MFC 608b and the valve 608c. A flow rate of the first inert gas is adjusted to a predetermined flow rate by the MFC 608b. According to the present embodiments, for example, the nitrogen ($N_2$) gas, a rare gas such as argon (Ar) gas, helium (He) gas and neon (Ne) gas, or a nonflammable gas such as carbon dioxide ($CO_2$) gas may be used as the dilution gas. In addition, the $N_2$ gas and the rare gas may also be referred to as a "nonflammable gas". According to the present embodiments of the present disclosure, an example in which the $N_2$ gas is mainly used as the dilution gas is described.

Error in Exhaust Gas Processing System

By the way, the detoxification process in the exhaust gas process chamber 601 may be stopped for some reason (error). In preparation for such a case, an error determination step S701 can be performed.

Error Determination Step: S701

Figure 7:
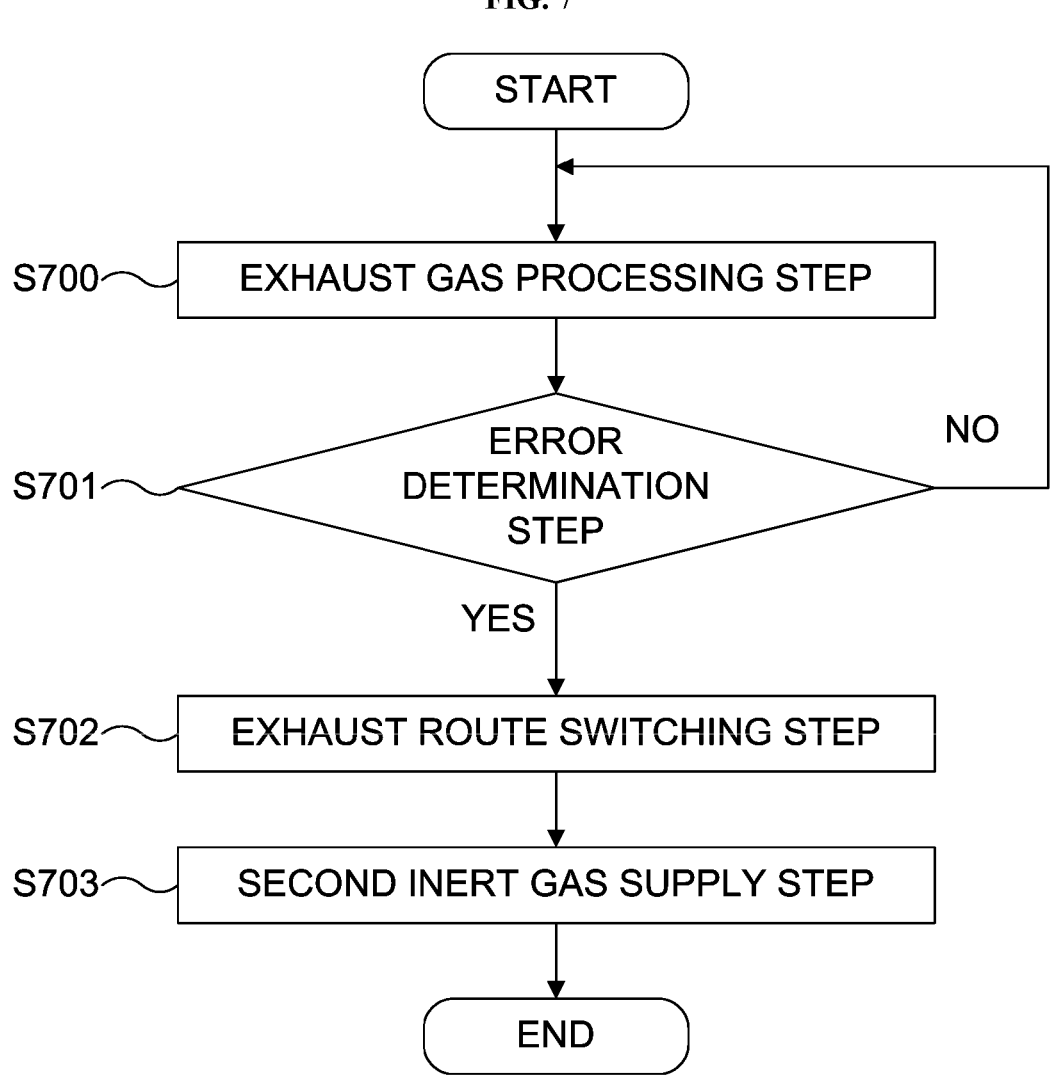
FIG. 7 is a flowchart schematically illustrating an exhaust gas processing step according to the embodiments of the present disclosure.

In the error determination step S701, one or both of the exhaust gas controller 601c and the controller 121 determines whether or not an abnormality has occurred in at least the detoxification process in the exhaust gas process chamber 601. Specifically, the detector 601b provided in the exhaust gas process chamber 601 detects whether or not the combustion in the exhaust gas process chamber 601 is stopped, and one or both of the exhaust gas controller 601c and the controller 121 determines, based on data such as a current value and a voltage value detected by the detector 601b, whether or not the detoxification process is stopped. When the detoxification process is not stopped ("NO" in FIG. 7), the procedure returns to the exhaust gas processing step S700, and the error determination step S701 is repeatedly performed at regular intervals. When the detoxification process is stopped ("YES" in FIG. 7), subsequently, an exhaust route switching step S702 is performed.

Exhaust Route Switching Step: S702

In the exhaust route switching step S702, an exhaust route is switched such that the exhaust gas discharged from the substrate processing apparatus 10 is not supplied to the exhaust gas process chamber 601. Specifically, the exhaust gas controller 601c or the controller 121 closes the valve 604 serving as the first valve and opens the valve 606 serving as the second valve so as to switch the exhaust route such that the exhaust gas from the substrate processing apparatus 10 is exhausted through the bypass exhaust pipe 605. The exhaust gas is exhausted to the exhaust equipment of the manufacturing factory of the semiconductor device through the bypass exhaust pipe 605. By switching the exhaust route as described above, it is possible to prevent (or suppress) the exhaust gas from being further supplied into the exhaust gas process chamber 601 and to suppress an increase in a concentration of the exhaust gas in the exhaust gas process chamber 601.

After the exhaust route switching step S702, the inert gas is supplied into the exhaust gas process chamber 601 so as to reduce (dilute) the concentration of the exhaust gas in the exhaust gas process chamber 601. When a large amount of the first inert gas is supplied through the gas supply pipe 608a serving as a part of the first inert gas supplier, a pressure of the first inert gas supply source 608 may decrease.

As shown in FIG. 3, the first inert gas supply source 608 supplying the first inert gas is configured to be capable of supplying the inert gas not only to the exhaust gas process chamber 601 but also to the inner tube 204 of the substrate processing apparatus 10. For example, the first inert gas supply source 608 may be connected to components such as the gas supply pipes 510, 520 and 530 described above as an inert gas supply source. In addition, the first inert gas supply source 608 may be connected not only to the substrate processing apparatus 10 but also to the plurality of substrate processing apparatuses including the substrate processing apparatus 10. In such a case, there is a possibility that the processing (that is, the substrate processing) of the substrate processing apparatus 10 may be affected by a temporary decrease in the pressure of the first inert gas supply source 608. In such a case, a predetermined processing (that is, the substrate processing) in the substrate processing apparatus 10 may be stopped. According to the present embodiments, when the first inert gas supply source 608 is a pure nitrogen source, there is a possibility that the heat treatment process and the film-forming process on the substrate (that is, the wafer 200) performed by the substrate processing apparatus 10 may be affected. When the first inert gas supply source 608 is an industrial nitrogen source, there is a possibility that a purge of the inner tube 204 of another substrate processing apparatus 10 or a purge of a wafer transfer space (not shown) in another substrate processing apparatus 10 may be affected. In addition, there is a possibility that the dilution process in the exhaust gas processing system 600 connected to another substrate processing apparatus 10 may be affected. Therefore, according to the present embodiments of the present disclosure, the controller 121 or the exhaust gas controller 601c is configured to be capable of supplying the first inert gas through the first inert gas supplier to the exhaust gas process chamber 601 while the exhaust gas is being processed (that is, the exhaust gas is being processed by the detoxification process) in the exhaust gas process chamber 601, and is configured to be capable of performing a second inert gas supply step S703 such that the second inert gas is supplied through the second inert gas supplier to the exhaust gas process chamber 601 when the process (that is, the detoxification process) in the exhaust gas process chamber 601 is stopped.

Second Inert Gas Supply Step: S703

The second inert gas supply step S703 will be described. In the present step, the valve 609c is opened to supply the second inert gas from the second inert gas supply source 609 to the exhaust gas process chamber 601 through the gas supply pipe 609a, the flow rate regulator 609b and the valve 609c.

The second inert gas is supplied at least until a gas concentration in the exhaust gas process chamber 601 is smaller than a predetermined concentration. Preferably, the second inert gas is continued to be supplied until a supply flow rate of the second inert from the second inert gas supply source 609 to the exhaust gas process chamber 601 fluctuates after being stabilized once. In addition, the second inert gas stored in the second inert gas supply source 609 may be used up in a single supply.

Further, while the second inert gas is being supplied, a supply of the first inert gas may be stopped. In addition, the flow rate of the first inert gas may be maintained at the same flow rate as that during the normal detoxification process, and the second inert gas may be supplied in addition to the supply of the first inert gas. In addition, the flow rate of the first inert gas may be changed so as to be smaller than a flow rate of the second inert gas.

Thereby, the second inert gas supply step S703 is performed.

Setting Flow Rate of Second Inert Gas

In the second inert gas supply step S703, a flow rate (corresponding to flow rate data of the second inert gas) of the flow rate regulator 609b may be set to a predetermined flow rate in advance, or may be set by calculating the flow rate data of the second inert gas based on the flow rate of the $H_2$ gas used in the film-forming step described above. Further, the flow rate data of the second inert gas may be calculated and set based on the flow rate of the $H_2$ gas and gas characteristic data described above. According to the present embodiments, the gas characteristic data may include at least one among an explosive concentration, a molecular weight, a gas type and the like. When the gas to be diluted is a flammable gas or an explosive gas, the flow rate of the inert gas is calculated such that the concentration thereof is smaller than the explosive concentration. For example, the flow rate of the inert gas may be calculated from an equation "a concentration X=(a flow rate of the flammable gas)/((the flow rate of the flammable gas)+(the flow rate of the inert gas))". In the present step, "the flow rate of the inert gas" in the equation may refer to one of the flow rate of the second inert gas and a total value of the flow rate of the first inert gas and the flow rate of the second inert gas. For example, when 50 slm of the $H_2$ gas is supplied, a lower limit value of the flow rate of the inert gas is 1,200 slm. When 80 slm of the $H_2$ gas is supplied, the lower limit value of the flow rate of the inert gas is 1,920 slm. In the present step, the explosive concentration of the $H_2$ gas is set to 4%. The gas characteristic data such as the explosive concentration and the molecular weight may be configured to be readable from safety data sheet (SDS) data of the gas. That is, the data described above may be configured to be recordable in the memory 121c.

When the flow rate regulator 609b capable of adjusting the flow rate of the second inert gas is constituted by a mass flow controller (MFC), the flow rate data of the second inert gas calculated by using the equation described above is set as a lower limit value of the flow rate regulator 609b. That is, a flow rate set for the flow rate regulator 609b cannot be smaller than the flow rate data of the second inert gas calculated by the equation. The setting is performed by the CPU 121a of the controller 121. Further, without setting the flow rate data of the second inert gas calculated as described above as the lower limit value of the flow rate regulator

609b, the flow rate data of the second inert gas calculated as described above may be output (notified) to the input/output device 122.

For example, when the flow rate regulator 609b is embodied by the needle valve or the orifice, the controller 121 may be configured to be capable of outputting (notifying) a message prompting a change of a flow rate set for the needle valve or a replacement with an orifice whose flow rate is higher than the flow rate calculated as described above to the input/output device 122. With such a configuration, a flow rate setting operation of the flow rate regulator 609b may be easily performed.

The flow rate setting is performed at least before the second inert gas supply step S703. In a case where the flow rate regulator 609b is embodied by a configuration such as the needle valve and the orifice whose flow rate cannot be easily adjusted, the needle valve may be adjusted or the orifice whose flow rate is set based on the calculation as described above may be installed when assembling the substrate processing apparatus 10 or the exhaust gas processing system 600.

For example, while the present embodiments are described by way of an example in which the flow rate of the inert gas supplied in the second inert gas supply step S703 is controlled, the inert gas may be supplied to the exhaust gas process chamber 601 without controlling the flow rate thereof. By supplying the inert gas without controlling the flow rate thereof, it is possible to shorten the time for reducing the gas concentration in the exhaust gas process chamber 601. However, a load of the exhaust equipment (not shown) of the semiconductor manufacturing factory connected to a rear portion of the exhaust gas process chamber 601 may increase or the exhaust gas processing system 600 should be embodied by a pressure resistant structure. Therefore, preferably, the flow rate of the inert gas is adjusted as described above to supply the inert gas to the exhaust gas process chamber 601.

For example, while the present embodiments are described by way of an example in which the valve 608c serving as a part of the first inert gas supplier and the valve 609c serving as a part of the second inert gas supplier are individually controlled for the exhaust gas process chamber 601, the three-way valve 607 configured to connect the exhaust gas process chamber 601, the first inert gas supplier and the second inert gas supplier may be installed instead of the valves 608c and 609c. In such a case, the controller 121 or the exhaust gas controller 601c is configured to be capable of controlling the three-way valve 607 when it is determined that the process (that is, the detoxification process) of the exhaust gas process chamber 601 is stopped.

(3) Effects According to Present Embodiments

According to the present embodiments described above, it is possible to obtain at least one among the following effects.

(a) It is possible to reduce a concentration of the flammable gas in the exhaust gas process chamber.

(b) It is possible to reduce a concentration of the flammable gas in the exhaust gas process chamber even when the detoxification process in the exhaust gas process chamber is stopped.

(c) By using the second inert gas supply source, it is possible to suppress a decrease in the pressure of the first inert gas supply source.

(d) By calculating the flow rate of the second inert gas based on the flow rate of the gas used in the film-forming step, it is possible to reduce an operation mistake of a worker (operator) of the substrate processing apparatus or a worker of the exhaust gas processing system.

(e) By calculating the flow rate of the second inert gas based on the flow rate of the gas used in the film-forming step and the gas characteristic data, it is possible to reduce the operation mistake of the worker (operator) of the substrate processing apparatus or the worker of the exhaust gas processing system.

(f) By setting the calculated flow rate of the second inert gas as the lower limit value, it is possible to reduce the operation mistake of the worker (operator) of the substrate processing apparatus or the worker of the exhaust gas processing system.

(g) By notifying the calculated flow rate of the second inert gas, it is possible to reduce the operation mistake of the worker (operator) of the substrate processing apparatus or the worker of the exhaust gas processing system.

Other Embodiments

While the technique of the present disclosure is described in detail by way of the embodiments described above, the technique of the present disclosure is not limited thereto. The technique of the present disclosure may be modified in various ways without departing from the scope thereof.

For example, the above-described embodiments are described by way of an example in which the $H_2$ gas is used as the reducing gas (flammable gas) when forming the tungsten film. However, the technique of the present disclosure is not limited thereto. For example, the silane-based gas such as the monosilane ($SiH_4$) gas and the disilane ($Si_2H_6$) gas may be used as the reducing gas (flammable gas). Since the silane-based gas such as the monosilane ($SiH_4$) gas and the disilane ($Si_2H_6$) gas is also flammable, the detoxification process described above should be performed. When 2 slm of the $SiH_4$ gas is supplied, the lower limit value of the flow rate of the second inert gas is 144 slm. When 2 slm of the $Si_2H_6$ gas is supplied, the lower limit value of the flow rate of the second inert gas is 398 slm. A lower limit value of the explosive concentration is 1.37% for the $SiH_4$ gas and 0.5% for the $Si_2H_6$ gas.

For example, the above-described embodiments are described by way of an example in which the step of forming the tungsten film is performed. However, the technique of the present disclosure is not limited thereto. For example, the technique of the present disclosure may also be applied to a step of forming a titanium nitride (TiN) film. In the step of forming the TiN film, $TiCl_4$ gas, the $SiH_4$ gas and the $NH_3$ gas may be used. The detoxification process described above may be performed when at least the $SiH_4$ gas of the gases described above is supplied.

For example, the technique of the present disclosure is not limited to the step of forming the film such as the tungsten film and the TiN film described above. For example, the technique of the present disclosure may also be applied to a step of forming a molybdenum (Mo) film. In the step of forming the molybdenum film, a molybdenum-containing gas such as one of $MoO_2Cl_2$ gas, $MoOCl_4$ gas and the like and a reducing gas such as one of the $H_2$ gas, the $SiH_4$ gas, the $Si_2H_6$ gas and the like may be used.

Further, the technique of the present disclosure is not limited to a step of forming a transition metal film described above. For example, the technique of the present disclosure may also be applied to a step of forming a silicon (Si) film. The step of forming the silicon film may be performed using the silane-based gas described above.

As described above, the technique of the present disclosure is not limited to the step of forming the tungsten film, and may also be applied to a process using the flammable gas.

Further, in addition to the process using the flammable gas, the technique of the present disclosure may also be applied to a process in which a concentration of a gas used therein should be lowered when being exhausted.

For example, the above-described embodiments are described by way of an example in which a double reaction tube constituted by the outer tube 203 and the inner tube 204 is used. However, the technique of the present disclosure is not limited thereto. For example, the technique of the present disclosure may also be applied to a single reaction tube.

While the technique of the present disclosure is described in detail by way of the embodiments, the technique of the present disclosure is not limited thereto. For example, the embodiments described above may be appropriately combined.

According to some embodiments of the present disclosure, it is possible to detoxify the process gas even when the detoxification apparatus is stopped.

What is claimed is:

1. A substrate processing apparatus comprising:
a reaction tube in which a substrate is accommodated;
a process gas supplier through which a process gas is supplied into the reaction tube;
an exhauster through which the process gas is exhausted from the reaction tube;
a first inert gas supply source configured to supply a first inert gas into the reaction tube;
an exhaust gas process chamber connected to the exhauster and in which an exhausted process gas is subject to a process;
a first inert gas supplier connected to the first inert gas supply source and configured to supply the first inert gas to the exhaust gas process chamber:
a second inert gas supplier connected to a second inert gas supply source and configured to supply a second inert gas to the exhaust gas process chamber;
an exhaust pipe through which a gas in the exhaust gas process chamber is exhausted; and
a controller configured to control the first inert gas supplier and the second inert gas supplier such that the first inert gas is separately supplied to the exhaust gas process chamber and the reaction tube from the first inert gas supply source while the process gas is subject to the process in the exhaust gas process chamber and the second inert gas is supplied to the exhaust gas process chamber through the second inert gas supplier when the process in the exhaust gas process chamber is stopped, wherein the controller is further configured to calculate flow rate data of the second inert gas based on a flow rate of the process gas supplied through the process gas supplier,
wherein the first inert gas supply source is connected to the reaction tube, and connected to the exhaust gas process chamber via the first inert gas supplier.

2. The substrate processing apparatus of claim 1, wherein the exhaust gas process chamber is provided with a detector configured to detect a process state in the exhaust gas process chamber, and
wherein the controller is further configured to determine whether the process is stopped based on data detected by the detector.

3. The substrate processing apparatus of claim 2, wherein the controller is further configured to control the first inert gas supplier and the second inert gas supplier such that the second inert gas is supplied in addition to a supply of the first inert gas after it is determined that the process in the exhaust gas process chamber is stopped.

4. The substrate processing apparatus of claim 2, wherein the controller is further configured to control the first inert gas supplier and the second inert gas supplier such that a flow rate of the second inert gas is greater than a flow rate of the first inert gas when the second inert gas is supplied to the exhaust gas process chamber through the second inert gas supplier after it is determined that the process in the exhaust gas process chamber is stopped.

5. The substrate processing apparatus of claim 2, wherein the exhaust gas process chamber, the first inert gas supplier and the second inert gas supplier are connected by a three-way valve, and wherein the controller is further configured to control the three-way valve when it is determined that the process in the exhaust gas process chamber is stopped.

6. The substrate processing apparatus of claim 2, further comprising:

a bypass exhaust pipe connected to an exhaust equipment and connected to the exhauster upstream of the exhaust gas process chamber;

a first valve provided at the exhauster upstream of the exhaust gas process chamber and downstream of a location where the bypass exhaust pipe is connected to the exhauster; and a second valve provided at the bypass exhaust pipe, wherein the controller is further configured to control the first valve and the second valve such that the first valve is closed and the second valve is opened after it is determined that the process in the exhaust gas process chamber is stopped.

7. The substrate processing apparatus of claim 1, wherein the controller is further configured to set a flow rate of a flow rate regulator capable of controlling a flow rate of the second inert gas based on the flow rate data of the second inert gas.

8. The substrate processing apparatus of claim 1, further comprising:

an input/output device configured to input and output data, wherein the controller is further configured to transmit a message corresponding to the flow rate data of the second inert gas to the input/output device.

9. The substrate processing apparatus of claim 1, wherein the controller is further configured to calculate flow rate data of the second inert gas based on a flow rate of the process gas supplied through the process gas supplier and characteristic data of the process gas.

10. The substrate processing apparatus of claim 1, wherein the second inert gas supplier is provided with a flow rate regulator configured to control a flow rate of the second inert gas to be equal to a predetermined flow rate.

11. A substrate processing method by using the substrate processing apparatus of claim 1, the method comprising:

(a) accommodating the substrate in the reaction tube;

(b) supplying the process gas into the reaction tube;

(c) exhausting the process gas from the reaction tube;

(d) supplying the process gas exhausted in (c) to the exhaust gas process chamber;

(e) processing the process gas in the exhaust gas process chamber;

(f) supplying the first inert gas into the reaction tube and the exhaust gas process chamber at least during (e); and (g) supplying the second inert gas to the exhaust gas process chamber after (e) is stopped.

12. A method of manufacturing a semiconductor device comprising the substrate processing method of claim 11.

13. A non-transitory computer-readable recording medium storing a program that causes, by a computer, the substrate processing apparatus of claim 1 to perform:

(a) accommodating the substrate in the reaction tube;

(b) supplying the process gas into the reaction tube;

(c) exhausting the process gas from the reaction tube;

(d) supplying the process gas exhausted in (c) to the exhaust gas process chamber;

(e) processing the process gas in the exhaust gas process chamber;

(f) supplying the first inert gas into the reaction tube and the exhaust gas process chamber at least during (e); and (g) supplying the second inert gas to the exhaust gas process chamber after (e) is stopped.

14. The substrate processing apparatus of claim 1, wherein the exhaust gas process chamber is provided with a detector configured to detect a state of detoxification process for an exhaust gas in the exhaust gas process chamber.

15. The substrate processing apparatus of claim 1, wherein the process gas comprises a reducing gas containing one of $H_2$ gas, $SiH_4$ gas or $Si_2H_6$ gas.

16. The substrate processing apparatus of claim 1, wherein the controller is further configured to set the flow rate data of the second inert gas as a lower limit.

17. The substrate processing apparatus of claim 1, wherein the controller is further configured to notify the flow rate data of the second inert gas.

18. The substrate processing apparatus of claim 1, wherein the controller is further configured to control the second inert gas supplier such that a supply of the second inert gas to the exhaust gas process chamber continues until a supply flow rate of the second inert gas fluctuates after being stabilized once.

19. The substrate processing apparatus of claim 1, wherein the controller is further configured to control the second inert gas supplier to supply the second inert gas to the exhaust gas process chamber such that a concentration of the process gas in the exhaust gas process chamber is lower than a predetermined concentration.

* * * * *